(12) United States Patent
Kostinovsky et al.

(10) Patent No.: US 11,676,926 B2
(45) Date of Patent: Jun. 13, 2023

(54) SOLDER JOINTS ON NICKEL SURFACE FINISHES WITHOUT GOLD PLATING

(71) Applicant: Schlumberger Technology Corporation, Sugar Land, TX (US)

(72) Inventors: Mark Alex Kostinovsky, Houston, TX (US); Steven O. Dunford, Missouri City, TX (US); Lweness Mazari, Sugar Land, TX (US)

(73) Assignee: Schlumberger Technology Corporation, Sunar Land, TX (US)

(*) Notice: Subject to any disclaimer, the term of this patent is extended or adjusted under 35 U.S.C. 154(b) by 102 days.

(21) Appl. No.: 17/000,966

(22) Filed: Aug. 24, 2020

(65) Prior Publication Data

US 2022/0059489 A1   Feb. 24, 2022

(51) Int. Cl.
*H01L 23/00*   (2006.01)

(52) U.S. Cl.
CPC .............. *H01L 24/16* (2013.01); *H01L 24/03* (2013.01); *H01L 24/05* (2013.01); *H01L 24/08* (2013.01); *H01L 24/11* (2013.01); *H01L 24/13* (2013.01); *H01L 24/43* (2013.01); *H01L 24/45* (2013.01); *H01L 24/48* (2013.01); *H01L 24/81* (2013.01); *H01L 24/85* (2013.01); *H01L 24/89* (2013.01); *H01L 2224/03019* (2013.01); *H01L 2224/03464* (2013.01); *H01L 2224/05147* (2013.01); *H01L 2224/05655* (2013.01); *H01L 2224/08225* (2013.01); *H01L 2224/08502* (2013.01); *H01L 2224/11019* (2013.01); *H01L 2224/11464* (2013.01); *H01L 2224/13147* (2013.01); *H01L 2224/13655* (2013.01); *H01L 2224/16225* (2013.01); *H01L 2224/16502* (2013.01); *H01L 2224/4312* (2013.01);
(Continued)

(58) Field of Classification Search
None
See application file for complete search history.

(56) References Cited

U.S. PATENT DOCUMENTS

| 5,173,130 A | 12/1992 | Kinoshita et al. |
| 6,524,644 B1 | 2/2003 | Wengenroth |

(Continued)

FOREIGN PATENT DOCUMENTS

| WO | 2007135930 A1 | 11/2007 |
| WO | 2017120609 A1 | 7/2017 |
| WO | 2018165640 A1 | 9/2018 |

OTHER PUBLICATIONS

International Search Report and Written Opinion of PCT Application No. PCT/US2021/071262 dated Dec. 13, 2021, 9 pages.

*Primary Examiner* — Hung K Vu
(74) *Attorney, Agent, or Firm* — Jeffrey D. Frantz

(57) ABSTRACT

A method for interconnecting two conductors includes creating a first nickel layer on a first conductor of an electrical component, producing a first non-gold protective layer on the first nickel layer, the first non-gold protective layer being configured to prevent the first nickel layer from oxidizing, creating a second nickel layer on a second conductor, producing a second non-gold protective layer on the second nickel layer, the second non-gold protective layer being configured to prevent the second nickel layer from oxidizing, and interconnecting the first and second nickel layers using a solder layer that interfaces with the first and second nickel layers between the first and second conductors.

12 Claims, 3 Drawing Sheets

(52) U.S. Cl.
CPC ............... *H01L 2224/43125* (2013.01); *H01L 2224/45147* (2013.01); *H01L 2224/45655* (2013.01); *H01L 2224/48225* (2013.01); *H01L 2224/48506* (2013.01); *H01L 2224/80355* (2013.01); *H01L 2224/81355* (2013.01); *H01L 2224/85355* (2013.01); *H01L 2924/15747* (2013.01)

(56) References Cited

U.S. PATENT DOCUMENTS

| | | |
|---|---|---|
| 10,566,103 B2 | 2/2020 | Shah et al. |
| 2007/0045869 A1 | 3/2007 | Ho et al. |
| 2009/0098724 A1 | 4/2009 | Yu |
| 2017/0141067 A1 | 5/2017 | Lin |
| 2019/0027266 A1* | 1/2019 | Shah ...................... H01B 1/026 |
| 2019/0393186 A1* | 12/2019 | Wu ..................... H01L 25/0657 |

* cited by examiner

SOLDER JOINTS ON NICKEL SURFACE FINISHES WITHOUT GOLD PLATING

BACKGROUND

Solder joints are used to make physical and electrical connections, e.g., between circuit boards or wire boards (interchangeably referred to herein as "circuit boards") and leads of components. In many electronic assemblies, the conductive components of the circuit boards and leads are made of copper, in some cases leads may be made of nickel-iron based alloys. Nickel may be plated over copper as a barrier layer to prevent corrosion of the copper or diffusion of the copper into connecting metals during soldering. Similarly, nickel may be plated over nickel-iron based alloy lead frame material as a barrier layer to prevent corrosion of the nickel-iron alloy or diffusion of the iron close to the connecting metals during soldering. A protective layer of nickel may be used over the nickel-iron based alloy base material to prevent/minimize diffusion of the iron into joining alloys such as solder, etc. However, nickel is prone to oxidation, and oxidized layers can prevent proper wetting of the solder and thus inhibit formation of a reliable solder joint. Accordingly, the nickel is generally plated with gold to protect the nickel from such oxidation. One way this is accomplished is by using electroless nickel with immersion gold (ENIG) plating, and another is by electrolytic nickel plating and electrolytic gold plating.

Immersion gold plating of nickel-plated conductors for solder joints has several drawbacks. For example, when the solder joint is created using the gold-plated surfaces, the solder joints can include excess gold intermetallic compounds (IMCs). These gold IMCs are brittle and can lead to fracture of the solder joint. Further, there is a risk of hyper-corrosion of the nickel (usually alloyed with phosphorus) during the immersion gold-plating process, which can create a "black pad" that prevents the formation of IMCs at the nickel interface, which are integral to the formation of a solder joint. Thicker gold layers applied using immersion gold plating process have a higher potential for hyper-corrosion, while thinner gold layers have a higher potential for allowing oxidation of the underlying nickel layer. Complicating the matter further, the detection of black pad conditions may be difficult and may require destructive testing (cross-sectioning). Additionally, gold plating carries a relatively high cost.

SUMMARY

Embodiments of the present disclosure provide a method for interconnecting two conductors. The method includes creating a first nickel layer on a first conductor of an electrical component, producing a first non-gold protective layer on the first nickel layer, the first non-gold protective layer being configured to prevent the first nickel layer from oxidizing, creating a second nickel layer on a second conductor, producing a second non-gold protective layer on the second nickel layer, the second non-gold protective layer being configured to prevent the second nickel layer from oxidizing, and interconnecting the first and second nickel layers using a solder layer that interfaces with the first and second nickel layers between the first and second conductors.

Embodiments of the present disclosure may also provide an electrical device for use in a wellbore. The device includes a component including a first conductor, a first nickel layer formed on the first conductor and configured to protect the first conductor from corrosion, and a first non-gold protective layer formed on the first nickel layer and configured to prevent the first nickel layer from oxidizing. The device also includes a circuit board including a second conductor, a second nickel layer formed on the second conductor and configured to protect the second conductor from corrosion, and a second non-gold protective layer formed on the second nickel layer and configured to prevent the second nickel layer from oxidizing. The device further includes a solder joint formed between the first and second nickel layers and having one or more intermetallic compounds including nickel from the first and second nickel layers so as to interconnect the first and second conductors electrically and physically.

Embodiments of the present disclosure further include a method for interconnecting two conductors. The method includes creating a first nickel layer on a first conductor of an electrical component, producing a first non-gold protective layer to the first nickel layer, the first non-gold protective layer being configured to prevent the first nickel layer from oxidizing, creating a second nickel layer on a second conductor, the second conductor comprising a conductive pad of a circuit board, producing a second non-gold protective layer on the second nickel layer, the second non-gold protective layer being configured to prevent the second nickel layer from oxidizing, interconnecting the first and second nickel layers using a solder layer that forms intermetallic compounds with the first and second nickel layers between the first and second conductors, and applying a non-gold protective layer on the solder joint, after interconnecting the first and second conductors, to prevent corrosion of the first and second nickel layers, the first and second conductors, and the solder joint.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Figure 1:
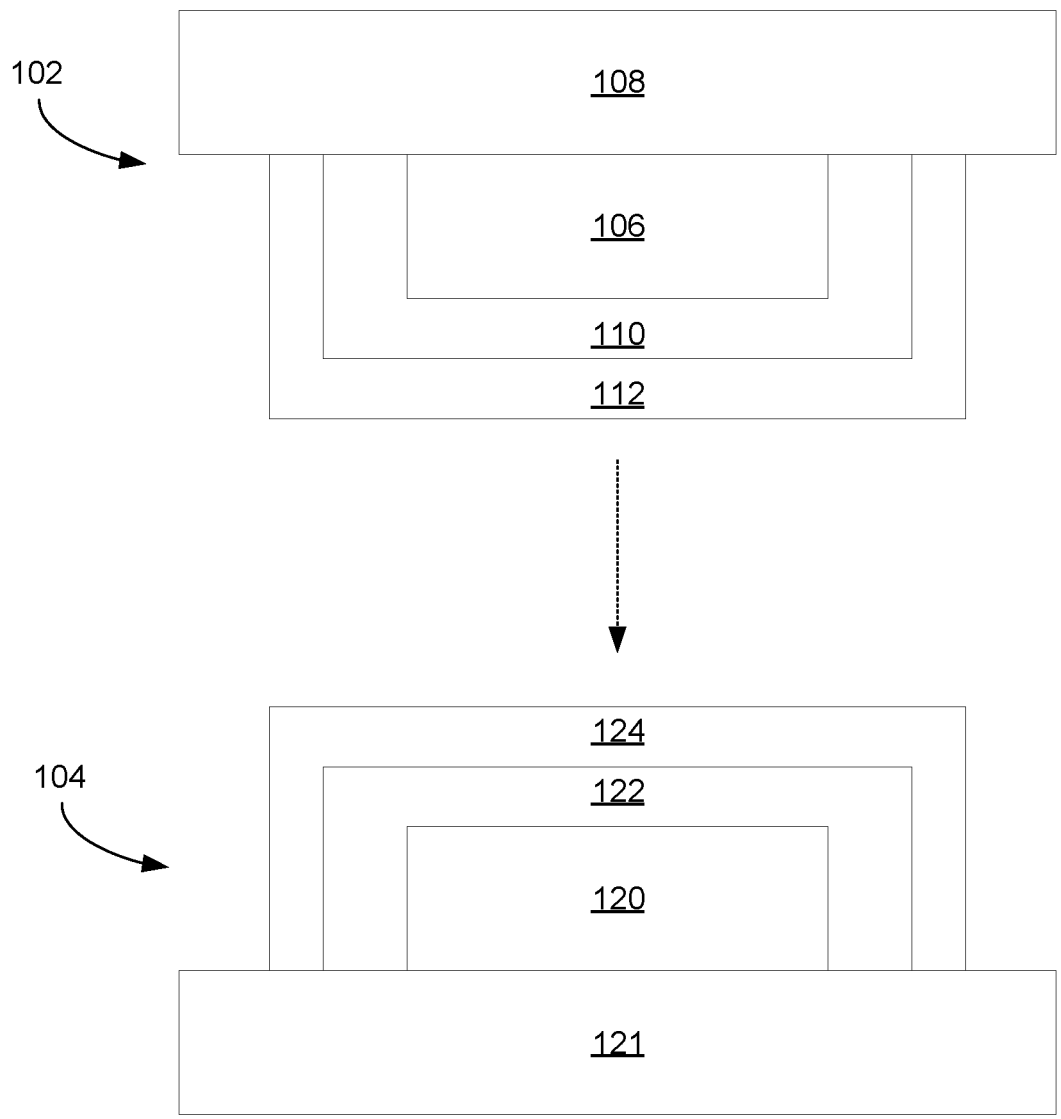
FIG. 1 illustrates a simplified, schematic view of a conductor of a component and a conductor of a circuit board prepared for soldering together, according to an embodiment.

Embodiments of the present disclosure may avoid using a gold-plating layer over a nickel-plated conductor. Rather, a protective barrier layer may be applied to the nickel-plated conductor. Further, in some embodiments, after the nickel-plated conductors are soldered together, another protective layer may be applied thereto to prevent corrosion from occurring on the metals/alloys that may be exposed to harsh environments. This may produce a joint with nickel interfaces on both sides with intermetallic compounds (IMCs) of tin and nickel (Sn—Ni) providing the wetting for the solder. These joints may be used for connecting any type of nickel-plated electrical conductor, e.g., connector pins, surface mount pads, through-hole surfaces, etc.

The following disclosure describes several embodiments for implementing different features, structures, or functions of the invention. Embodiments of components, arrangements, and configurations are described below to simplify the present disclosure; however, these embodiments are provided merely as examples and are not intended to limit the scope of the invention. Additionally, the present disclosure may repeat reference characters (e.g., numerals) and/or letters in the various embodiments and across the Figures provided herein. This repetition is for the purpose of simplicity and clarity and does not in itself dictate a relationship between the various embodiments and/or configurations discussed in the Figures. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the embodiments presented below may be combined in any combination of ways, e.g., any element from one embodiment may be used in any other embodiment, without departing from the scope of the disclosure.

Additionally, certain terms are used throughout the following description and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function. Additionally, in the following discussion and in the claims, the terms "including" and "comprising" are used in an open-ended fashion, and thus should be interpreted to mean "including, but not limited to." All numerical values in this disclosure may be exact or approximate values unless otherwise specifically stated. Accordingly, various embodiments of the disclosure may deviate from the numbers, values, and ranges disclosed herein without departing from the intended scope. In addition, unless otherwise provided herein, "or" statements are intended to be non-exclusive; for example, the statement "A or B" should be considered to mean "A, B, or both A and B."

FIG. 1 illustrates a side, schematic view of an electrical component 102 and a circuit board 104 which may be connected (e.g., soldered) together, according to an embodiment. It will be appreciated that the view of FIG. 1 is not drawn to scale, and the layers that will be described herein below may be exaggerated in thickness for ease of description. For example, electrical component 102 may be or include flip chip die or through silicon via, chip scale packaging, or semiconductors packaged in ceramics and plastic encapsulation materials, or the like. As illustrated by way of example, the component 102 may include a first conductor 106. The first conductor 106 may be, for example, a conductive lead, such as a pin, wire, or pad. Further, the first conductor 106 may be made at least partially from copper, but in other embodiments, may be made from silver or any other suitable material such as, for example, nickel-iron based alloy. The component 102 may also include a substrate 108 connected to the first conductor 106.

A first nickel layer 110 may be formed over a surface of the first conductor 106, at least. It will be appreciated that the first conductor 106 may be recessed into the substrate 108, such that only the outer surface of the first conductor 106 is exposed and covered with the first nickel layer 110. In other embodiments, the conductor 106 may extend from the substrate 108, or, if the first conductor 106, as will be described in greater detail below, there may not be a substrate 108. The first nickel layer 110 may be a substantially pure nickel, containing at most traces of other elements. In other embodiments, the nickel may be a nickel alloy, e.g., including nickel and one or more of phosphorus, boron, cobalt, or another metal. The first nickel layer 110 may be plated on the first conductor 106, e.g., using electroless plating or electrolytic plating. The first nickel layer 110 may be formed in any thickness suitable to prevent or otherwise protect the underlying conductor 106 from corrosion or oxidation. The first nickel layer 110 may be plated directly onto the first conductor 106, or a protective layer may be interposed therebetween.

A first non-gold protective layer 112 may be formed over the first nickel layer 110. The protective layer 112 may be a barrier layer that includes all or a portion of a reactive nitrogen-containing molecule deposited onto the surface of a first nickel layer 110. In various embodiments, the nitrogen-containing molecule can include primary, secondary, or tertiary nitrogen(s) covalently bound to carbon. The nitrogen may be present as a substituted aliphatic hydrocarbon or a substituted aromatic hydrocarbon. According to some embodiments, nitrogen can include a substituted siloxane with the nitrogen covalently bound to silicon or with a nitrogen covalently bound to a carbon group which is covalently bound to silicon. The first protective layer 112 may thus chemisorb nickel atoms and thereby passivate the first nickel layer 110. In other embodiments, other types of non-gold protective layers 112 may be employed. The first protective layer 112 may be formed or otherwise created in any suitable manner, such as by immersion of the surface of the conductor 106, spraying onto the conductor 106, brushing thereon, etc.

The circuit board (e.g., a printed circuit board (PCB) or printed wiring board (PWB)) 104 may include a second conductor 120. Accordingly, the circuit board 104 may include a substrate 121 having or otherwise coupled to a second conductor 120. The use of the terms "first" and "second" herein is merely to differentiate two elements from one another and not to be construed as requiring any particular number of elements, regardless of the name given thereto. The substrate 121 may be or include any material that contains or supports interconnecting circuitry including, for example, fiber-reinforced organic polymers, non-reinforced polymers, ceramics, silicon, glass or other non-conductive materials. The second conductor 120 may be a pad, wire, through-hole, pin, or the like. Further, the second conductor 120 may be recessed into the substrate 121 or may extend therefrom as shown.

The surface of the second conductor 120 may be prepared in a similar, or the same, way as the exposed surface(s) of the first conductor 106 of the electrical component 102. Accordingly, the second conductor 120 may be plated with a second nickel layer 122, and a second non-gold protective layer 124 may be created on the second nickel layer 122 to prevent oxidation of the second nickel layer 122.

Figure 2:
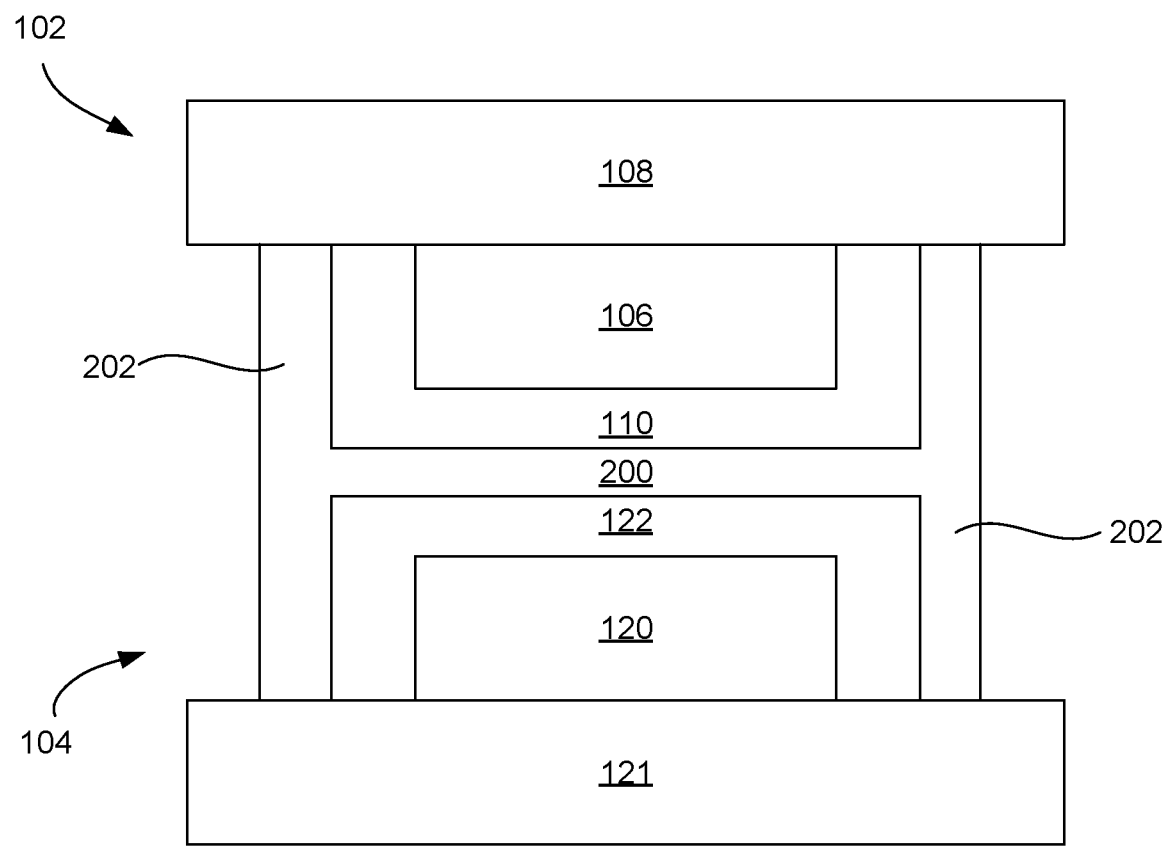
FIG. 2 illustrates a simplified, schematic view of the conductors after soldering together, according to an embodiment.

FIG. 2 illustrates a simplified, schematic view of the component 102 soldered to the circuit board 104, according to an embodiment. As shown, a solder layer 200 is provided between the component 102 and the circuit board 104. The solder layer 200 may be produced using any soldering process, such as wave, reflow, vapor phase, laser, e-beam, sintering, or hand soldering operations.

The solder layer 200 may include intermetallic compounds (IMCs) of nickel, e.g., at the surfaces of the solder layer 200 that are adjacent to the respective first and second nickel layers 110, 122. Accordingly, the solder layer 200 may provide a nickel interfaces on both sides, e.g., where the solder layer 200 meets the nickel layers 108, 122, between the conductors 106, 120. Further, the solder layer 200 may include small amounts of the protective layers 112, 124 modified therein After soldering the first and second conductors 106, 120 together, a third non-gold protective layer 202 may be applied to the soldered joint. The third non-gold protective layer 202 may be formed from the same material as the first and/or second non-gold protective layers 110, 122. In some embodiments, the first and second protective layers 110, 122 may fully envelope the surfaces of the conductors 106, 120, and thus the third protective layer 202 may be applied over the first and second protective layers 110, 122. In other embodiments, the first and second protective layers 110, 122 may erode during the interconnection process and the third protective layer 202 may cover any exposed surfaces of the solder joint. The third protective layer 202 may thus be a post-treatment, which may prevent corrosion of the conductors 106, 120, the first and second nickel layers 110, 122, and/or the solder layer 200. This may allow for other types of protection of the soldered joint to be omitted.

For example, gold-plating the nickel layers may be avoided. Since there is no gold in the solder joint, the potential for gold embrittlement may be eliminated. Additionally, without a gold plating, the risk of hyper-corrosion due to the immersion gold plating process is also avoided.

In some embodiments, the use of the protective layers as a pre- and/or post-treatment may be applicable to limit silver migration in electronic assemblies in which silver is used in the interconnection materials and plating of the nickel interfaces. For example, this may be applied to multi-chip modules, single-chip modules, printed wiring assemblies. For example, this may be applied to silver transient liquid phase sintering, silver wire bonds, silver filled conductive adhesives, and solder with silver content.

In some embodiments, the electrical component 102 and the circuit board 104 may form at least a portion of an electronic device that is configured to be used in a wellbore, e.g., as part of a downhole assembly. Examples of such devices may include measurement or logging while drilling sensors, downhole telemetry equipment, steering equipment, temperature or pressure sensors, etc. In these types of downhole devices, electronic failure, e.g., from fracture of a solder joint, may cause expensive delays, as the tool including the fractured joint may have to be removed from potentially deep in the well for repair.

Figure 3:
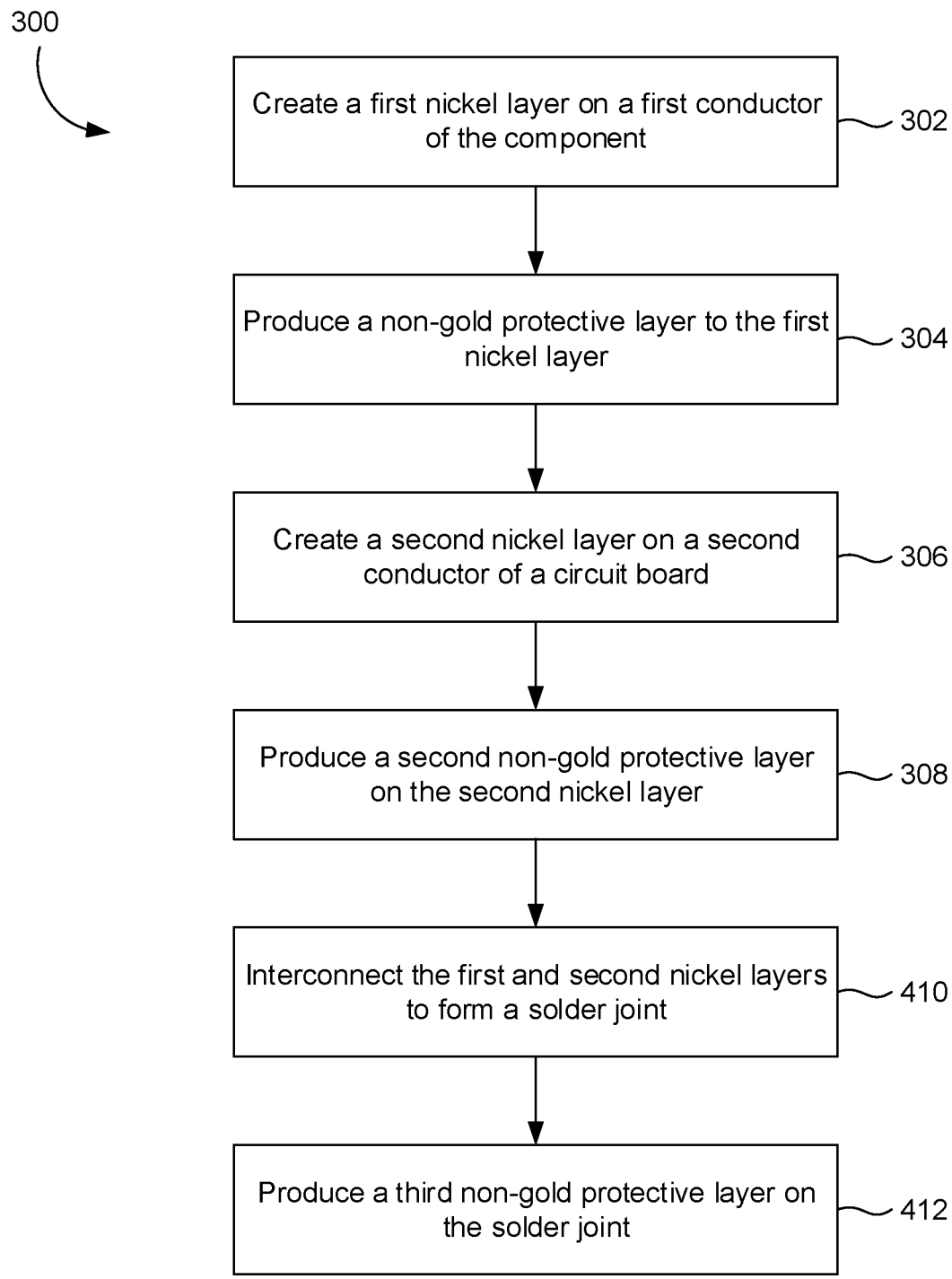
FIG. 3 illustrates a flowchart of a method for soldering together two conductors, according to an embodiment.

FIG. 3 illustrates a flowchart of a method 300 for interconnecting two conductors 106, 110, according to an embodiment. The method 300 may include creating a first nickel layer 110 on a first conductor 106 of the component 102, as at 302. For example, the first conductor 106 may be a copper material, and the first nickel layer 110, which may be an alloy of nickel and one or more other metals, may be plated onto the conductor 106.

The method 300 may also include producing (e.g., applying) a first non-gold protective layer to the first nickel layer, as at 304. The first non-gold protective layer 112 may be configured to prevent the first nickel layer 110 from oxidizing. For example, the non-gold protective layer 112 may contain, or contain part of, a nitrogen-containing molecule, which may be configured to passivate the first nickel layer 110.

The method 300 may further include creating a second nickel layer 122 on a second conductor 120 of a circuit board 104, as at 306. Like the first nickel layer 110, the second nickel layer 122 may be created by electroless or electrolytic plating. Further, the second nickel layer 122 may be substantially pure nickel or a nickel alloy including nickel and one or more other metals (e.g., boron, cobalt, and/or phosphorus). In an embodiment, the second conductor 120 may be a copper material.

The method 300 may further include producing a second non-gold protective layer 124 on the second nickel layer 122 on the second conductor 120, as at 308. The second non-gold protective layer 124 may be formed by applying the non-gold protective material to the second nickel layer 122, e.g., using a brush, by immersion or spraying, etc.

The method 300 may further include interconnecting the first and second nickel layers 108, 122 using a solder layer 200 that interfaces with the first and second nickel layers 108, 122 between the first and second conductors 106, 120. For example, the solder layer 200 may form Sn—Ni intermetallic compounds at the surfaces thereof proximal to the respective nickel layers 108, 122.

In some embodiments, the method 300 may also include producing a third non-gold protective layer 202 on the solder joint, as at 312. This may be performed after soldering the first and second nickel layers 112, 122, to prevent corrosion of any of components of the solder joint, e.g., the conductors 106, 110, the nickel layers 112, 122, etc. This may include coating one or more portions of the substrates 108 and/or 121 in order to cover the solder joint. Accordingly, any gold layers may be omitted from the solder joint.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. Moreover, the order in which the elements of the methods are illustrated and described may be re-arranged, and/or two or more elements may occur simultaneously. The embodiments were chosen and described in order to best explain the principals of the invention and its practical applications, to thereby enable others skilled in the art to best utilize the invention and various embodiments with various modifications as are suited to the particular use contemplated.

The invention claimed is:

1. A method for interconnecting two conductors, comprising:

creating a first nickel layer on a first conductor of an electrical component;

producing a first non-gold protective layer on the first nickel layer, the first non-gold protective layer being configured to prevent the first nickel layer from corroding;

creating a second nickel layer on a second conductor;

producing a second non-gold protective layer on the second nickel layer, the second non-gold protective layer being configured to prevent the second nickel layer from corroding;

interconnecting the first and second nickel layers using a solder layer that interfaces with the first and second nickel layers between the first and second conductors; and applying a third non-gold protective layer after interconnecting the first and second conductors, to prevent corrosion of the first and second conductors, the first and second nickel layers, or a combination thereof.

2. The method of claim 1, wherein the second conductor is a conductive pad of a circuit board.

3. The method of claim 1, wherein the first and second non-gold protective layers are produced instead of producing a gold layer on the first nickel layer or the second nickel layer.

4. The method of claim 1, wherein the first and second nickel layers are not plated with gold.

5. The method of claim 1, wherein the first and second conductors comprise copper.

6. The method of claim 1, wherein the first nickel layer, the second nickel layer, or both comprises a nickel alloy.

7. The method of claim 6, wherein the nickel alloy comprises nickel and one or more of phosphorus, boron, iron, or cobalt.

8. The method of claim 1, wherein the first nickel layer, the second nickel layer, or both comprises substantially pure nickel.

9. The method of claim 1, wherein the first non-gold protective layer comprises a nitrogen-containing molecule, and wherein the second non-gold protective layer comprises another nitrogen-containing molecule.

10. The method of claim 1, wherein producing the first non-gold protective layer comprises immersing at least a portion of the first conductor in a non-gold protective layer material, or spraying the first conductor with the non-gold protective layer material, or brushing the non-gold protective layer material onto the first conductor.

11. A method for interconnecting two conductors, comprising:
creating a first nickel layer on a first conductor of an electrical component;
producing a first non-gold protective layer to the first nickel layer, the first non-gold protective layer being configured to prevent the first nickel layer from corroding;
creating a second nickel layer on a second conductor, the second conductor comprising a conductive pad of a circuit board;
producing a second non-gold protective layer on the second nickel layer, the second non-gold protective layer being configured to prevent the second nickel layer from corroding; and
interconnecting the first and second nickel layers using a solder layer that forms intermetallic compounds with the first and second nickel layers between the first and second conductors; and
producing a third non-gold protective layer on the a solder joint, after interconnecting the first and second conductors, to prevent corrosion of the first and second nickel layers, the first and second conductors, and the solder joint.

12. The method of claim 11, wherein the first nickel layer, the second nickel layer, or both comprises substantially pure nickel.

* * * * *